(12) United States Patent
Murakami

(10) Patent No.: US 10,493,667 B2
(45) Date of Patent: Dec. 3, 2019

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Yosuke Murakami, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 964 days.

(21) Appl. No.: 14/271,777

(22) Filed: May 7, 2014

(65) Prior Publication Data
US 2014/0339734 A1 Nov. 20, 2014

(30) Foreign Application Priority Data

May 14, 2013 (JP) .................................. 2013-102597
Apr. 15, 2014 (JP) .................................. 2014-083998

(51) Int. Cl.
*B29C 65/72* (2006.01)
*B29C 43/02* (2006.01)
*B29C 35/02* (2006.01)
*B29C 43/58* (2006.01)
*G03F 7/00* (2006.01)

(52) U.S. Cl.
CPC ........ *B29C 35/0288* (2013.01); *B29C 43/021* (2013.01); *B29C 43/58* (2013.01); *G03F 7/0002* (2013.01)

(58) Field of Classification Search
CPC ....... Y02B 40/34; Y10T 428/231; B32B 3/06; B32B 3/04; B32B 2509/10; B29C 65/72; B29C 43/021; B29C 43/58; B29C 35/0288; G03F 7/0002; G03F 7/7055
See application file for complete search history.

(56) References Cited

U.S. PATENT DOCUMENTS

2013/0093113 A1    4/2013   Hayashi et al.

FOREIGN PATENT DOCUMENTS

| JP | 2004335808 A | 11/2004 |
| JP | 2010-087526 | 4/2010 |
| JP | 2013-089663 A | 5/2013 |
| JP | 2013-541434 A | 11/2013 |
| WO | 2012/019874 A1 | 2/2012 |

OTHER PUBLICATIONS

Office Action issued in Japanese Appln. No. 2014-083998 dated Feb. 5, 2018. English translation provided.
Office Action issued in Japanese Appln. No. 2014-083998 dated Feb. 5, 2018.

*Primary Examiner* — Christopher T Schatz
(74) *Attorney, Agent, or Firm* — Rossi, Kimms & McDowell LLP

(57) ABSTRACT

The present invention provides an imprint apparatus for transferring a pattern of a mold to a shot region on a substrate by curing an imprint material on the substrate while the mold and the imprint material are in contact with each other, comprising a heating unit configured to deform a shape of the shot region by heating each of a plurality of portions of the substrate, and a control unit configured to obtain a target heat quantity in each of the plurality of portions so that the shape of the shot region becomes closer to a target shape, generate a heating profile for each of the plurality of portions so that a heat quantity in the portion becomes equal to the target heat quantity, and control the heating unit to heat each of the plurality of portions according to the generated heating profile.

21 Claims, 12 Drawing Sheets

FIG. 7
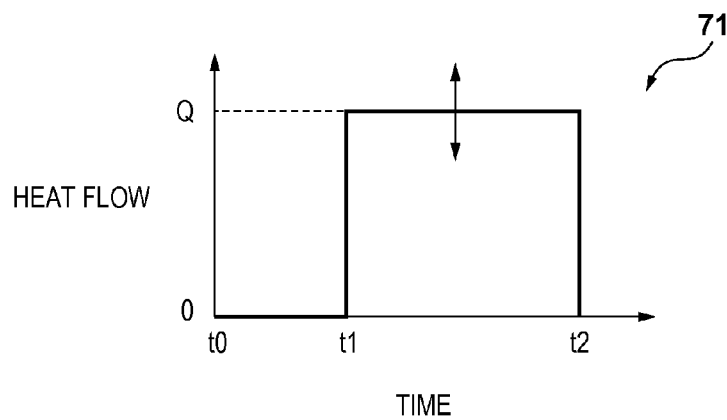
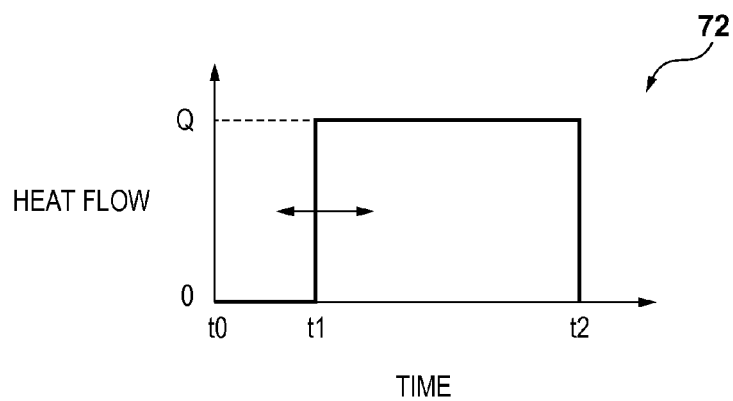
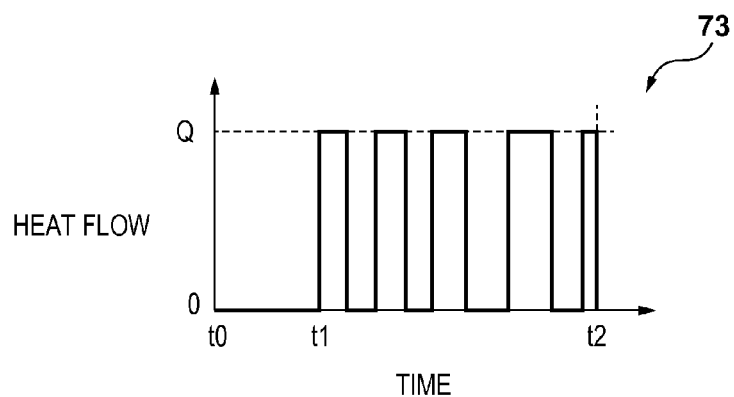

FIG. 8
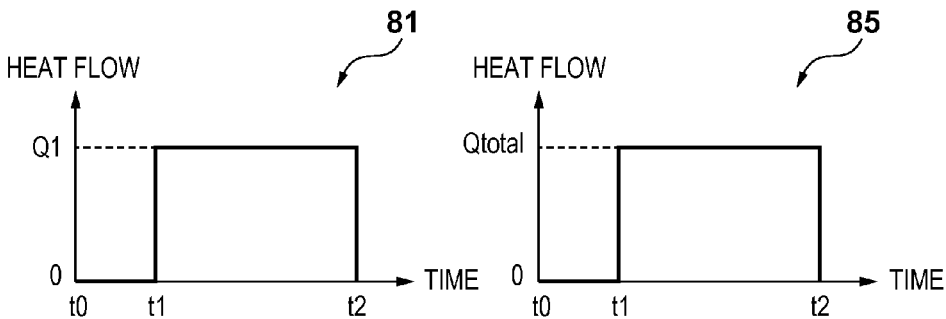
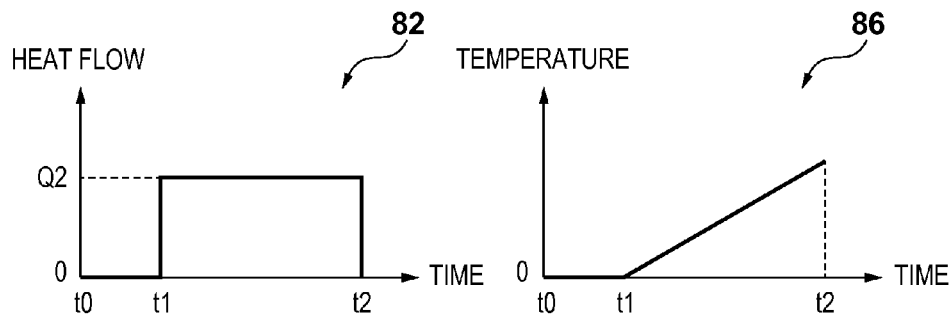
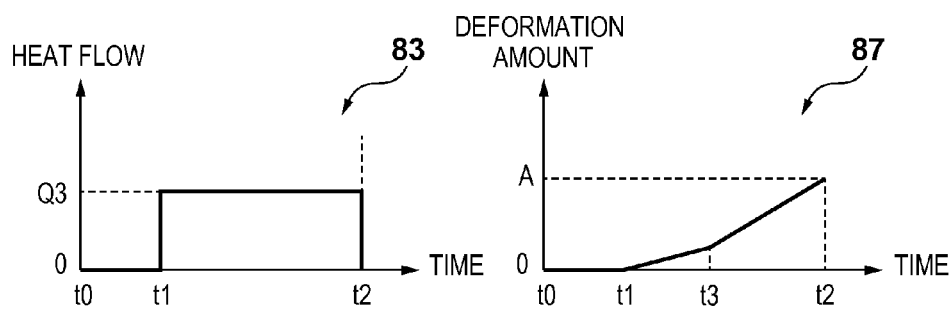
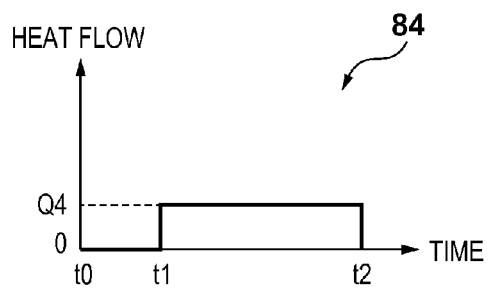

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint technique of transferring a pattern formed on a mold to an imprint material on a substrate is attracting attention as one of mass-production lithography techniques for magnetic storage media, semiconductor devices, and the like. In an imprint apparatus using such imprint, technique, a mold having a pattern formed on it and an imprint material supplied onto a substrate are brought into contact with each other, and the imprint material is cured in this state. The pattern can be formed on the substrate by separating the mold from the cured imprint material.

The manufacture of a semiconductor device or the like requires a step of overlaying a plurality of patterns on a single substrate. In an imprint apparatus, therefore, it is important to transfer the pattern of a mold by accurately overlaying the pattern region of the mold on a shot region formed on a substrate. Accordingly, Japanese Patent No. 4512167 has proposed an imprint apparatus that corrects a magnification component between a substrate and a mold using the difference in thermal expansion coefficient between the substrate (shot region) and the mold (pattern region) by controlling the temperature of the substrate and mold.

The imprint apparatus described in Japanese Patent. No. 4512167 can perform only magnification correction between the substrate and the mold since it controls the temperature of the substrate and mold as a whole. However, a shot region on the substrate may be deformed to include components such as a trapezoid component and barrel component in a series of semiconductor device manufacturing steps and the like. Even if such deformation has occurred in the shot region, it is important to accurately transfer the pattern of the mold to the shot region.

SUMMARY OF THE INVENTION

The present invention provides an imprint apparatus advantageous in accurately transferring the pattern of a mold to a shot region formed on a substrate.

According to one aspect of the present invention, there is provided an imprint apparatus for transferring a pattern of a mold to a shot region on a substrate by curing an imprint material on the substrate while the mold and the imprint material are in contact with each other, comprising: a heating unit configured to deform a shape of the shot region by heating each of a plurality of portions of the substrate; and a control unit configured to obtain a target heat quantity in each of the plurality of portions so that the shape of the shot region becomes closer to a target shape, generate a heating profile for each of the plurality of portions so that a heat quantity in the portion becomes equal to the target heat quantity by combining heat quantities in the portion, and control the heating unit to heat each of the plurality of portions according to the generated heating profile.

Further features of the present invention will become apparent from the following description of exemplary embodiments with reference to the attached drawings.

BRIEF DESCRIPTION OF THE DRAWINGS

FIG. 7 is a view showing an example of the method of generating a heating profile;

FIG. 8 is a view showing an example of the heating profiles in the respective portions of the shot region;

DESCRIPTION OF THE EMBODIMENTS

Figure 1:
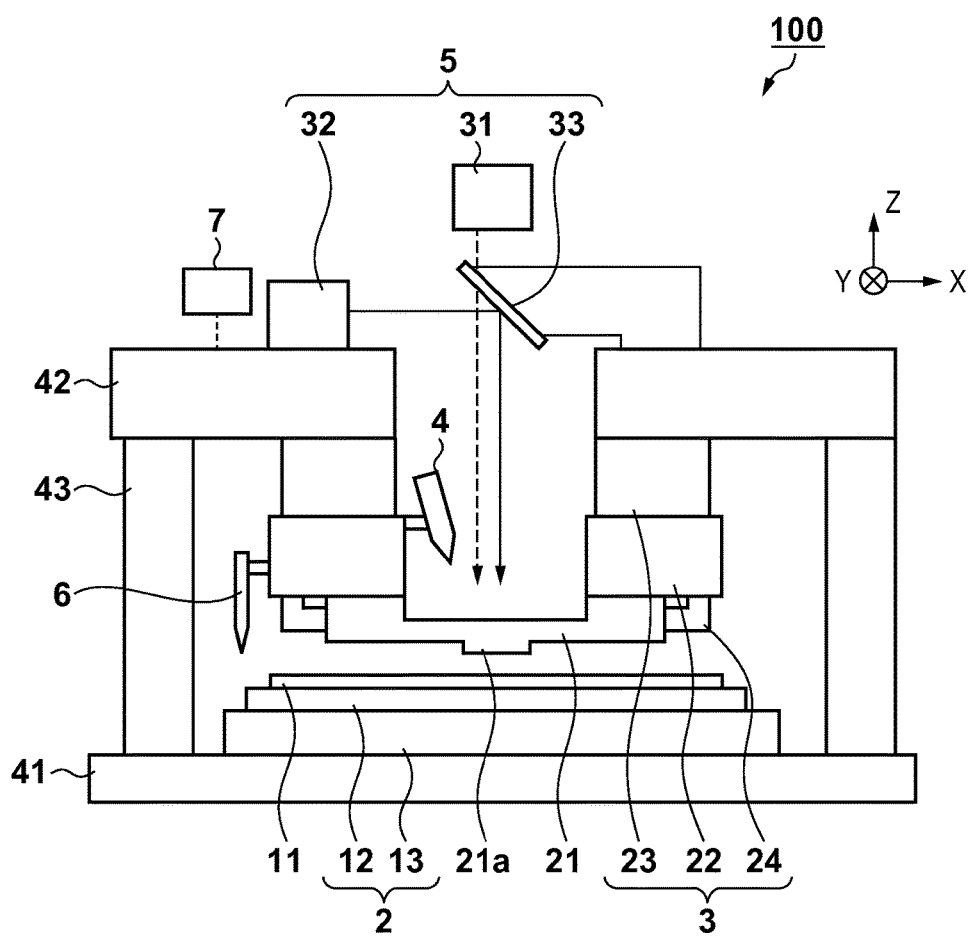
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given. Also, assume that directions which are perpendicular to each other on a substrate surface will be defined as X and Y directions, respectively, and a direction perpendicular to the substrate surface will be defined as a Z direction in the respective drawings.

First Embodiment

An imprint apparatus 100 according to the first embodiment of the present invention will be described with reference to FIG. 1. The imprint apparatus 100 is used to manufacture a semiconductor device or the like, and cures an imprint material (resin) on a substrate while a mold 21 having a pattern formed on it is in contact with the imprint material. The imprint apparatus 100 can transfer the pattern onto the substrate by widening the spacing between a substrate 11 and the mold 21 and separating the mold 21 from the cured imprint material. Examples of a method of curing an imprint material are a heat cycle method using heat and a photo-curing method using light. The imprint apparatus 100 of the first embodiment adopts the photo-curing method. The photo-curing method is a method of curing a resin by supplying an uncured ultraviolet-curing resin (to be referred to as a resin hereinafter) as the imprint material onto a substrate, and irradiating the resin with ultraviolet rays while the mold 21 and the resin are in contact with each other. After the resin is cured by ultraviolet irradiation, a pattern can be formed on the substrate by separating the mold 21 from the resin.

FIG. 1 is a view showing the imprint apparatus 100 according to the first embodiment. The imprint apparatus 100 includes a substrate stage 2 for holding the substrate 11, a mold holding unit 3 for holding the mold 21, an alignment measurement unit 4, an irradiation unit 5, and a resin supply unit 6. The mold holding unit 3 is fixed to a bridge plate 42 supported by a base plate 41 via a column 43. The substrate stage 2 is fixed to the base plate 41. The imprint apparatus 100 also includes a control unit 7 which includes a CPU and a memory and controls imprint processing (controls each unit of the imprint apparatus 100).

As the substrate 11, for example, a single-crystal silicon substrate, SOI (Silicon on Insulator) substrate, or the like is used. The resin supply unit 6 (to be described later) supplies a resin (ultraviolet-curing resin) to the upper surface (processed surface) of the substrate 11. Furthermore, the mold 21 is generally made of a material such as quartz capable of transmitting ultraviolet rays. A projection-and-recess pattern to be transferred to the substrate 11 is formed on a partial region 21a (pattern region) of the substrate-side surface of the mold 21.

The substrate stage 2 includes a substrate chuck 12 and a stage driving unit 13. When the mold 21 and the resin on the substrate are brought into contact with each other, the substrate stage 2 moves the substrate 11 in the X and Y directions to align the substrate 11 and the mold 21. The substrate chuck 12 holds the substrate 11 by, for example, a vacuum suction force or an electrostatic force. The stage driving unit 13 mechanically holds the substrate chuck 12, and drives the substrate chuck 12 in the X and Y directions. As the stage driving unit 13, for example, a linear motor may be used. The stage driving unit 13 may be formed by a plurality of driving systems including a coarse driving system and fine driving system. Also, the stage driving unit 13 may have a driving function of driving the substrate 11 in the Z direction, a position adjustment function of adjusting the position of the substrate by rotating the substrate 11 in the θ direction (about, the Z-axis), a tilt function of correcting the tilt of the substrate 11, and the like.

The mold holding unit 3 includes a mold chuck 22 for holding the mold 21 by, for example, a vacuum suction force or an electrostatic force, and a mold driving unit 23 for driving the mold chuck 22 in the Z direction. Each of the mold chuck 22 and mold driving unit 23 has an opening region in its central portion (interior), and is configured so that the substrate 11 is irradiated, through the mold 21, with light emitted by the irradiation unit 5. At this time, deformation including components such as a magnification component, trapezoid component, and barrel component may have occurred in the mold 21 due to a manufacturing error or heat deformation. The mold holding unit 3 includes a deformation unit 24 for deforming the mold 21 by applying a force to each of a plurality of portions on the side surface of the mold 21. In this way, it is possible to correct deformation in the region 21a on the mold by causing the deformation unit 24 to apply a force to each of the plurality of portions.

The mold driving unit 23 includes, for example, an actuator such as a linear motor or air-cylinder, and drives the mold chuck 22 (mold 21) in the Z direction to bring the mold 21 and the resin on the substrate into contact with each other or separate them from each other. Since the mold driving unit 23 is required to perform alignment with high accuracy when the mold 21 and the resin on the substrate are brought into contact with each other, it may be formed by a plurality of driving systems including a coarse driving system and fine driving system. In addition to the function of driving the mold in the Z direction, the mold driving unit 23 may have a position adjustment function of adjusting the position of the mold in the X, Y, and θ directions, a tilt function of correcting the tilt of the mold 21, and the like. Although an operation of changing the distance between the substrate 11 and the mold 21 is performed by the mold driving unit 23 in the imprint apparatus 100 of the first embodiment, it may be performed by the stage driving unit 13 of the substrate stage 2 or by both of the mold driving unit 23 and the stage driving unit 13 relative to each other.

The alignment measurement unit 4 measures the difference (to be referred to as a shape difference hereinafter) between the shape of a shot region 8 formed on the substrate and the shape of the region 21a (pattern region) on the mold. An example of a method of measuring the shape difference is a method of detecting a plurality of alignment marks formed in the shot region 8 and the region 21a on the mold. Alignment marks are formed at corresponding positions in the shot region and pattern region. The alignment measurement unit 4 observes by overlaying the alignment mark in the shot region 8 on that in the region 21a on the mold. This allows the alignment measurement unit 4 to detect a positional shift amount between the alignment mark in the shot region 8 and that in the region 21a on the mold, and measure the shape difference between the shot region 8 and the region 21a on the mold based on the positional shift amount. Note that deformation including components such as a magnification component, trapezoid component, and barrel component may have occurred in the shot region 8 on the substrate due to the influence of a series of semiconductor device manufacturing steps and the like. In this case, to accurately transfer the pattern of the mold 21 to the shot region 8 on the substrate, it is necessary to deform the shot region 8 to conform to the shape (target shape) of the region 21a on the mold, which has been deformed by the deformation unit 24. To do this, the imprint apparatus 100 of the first embodiment includes a heating unit 32 which heats the substrate 11 by irradiating the substrate 11 (shot region 8) with light, and deforms the shot region 8, as will be described later.

The irradiation unit 5 includes an exposure unit 31 which emits light for curing the resin on the substrate, the heating unit 32 which emits light for heating the shot region 8 on the substrate, and an optical member 33 which guides the light emitted by the exposure unit 31 and that emitted by the heating unit 32 onto the substrate. The exposure unit 31 can include a light source which emits light (ultraviolet rays) for curing the resin on the substrate, and a plurality of optical elements which adjust the light emitted by the light source to appropriate one for imprint processing. The heating unit 32 can include a light source which emits light for heating the shot region 8 on the substrate, and an optical system which adjusts the light emitted by the light source to appropriate one for heating the shot region 8. The light source of the heating unit 32 emits light having a wavelength (for example, 400 nm to 2,000 nm) appropriate for heating the shot region 8 without curing the resin supplied onto the substrate. The optical system of the heating unit 32 includes a plurality of optical elements which shape the light emitted by the light source of the heating unit 32 so that a temperature distribution in the shot region 8 becomes a desired temperature distribution, that is, the shape of the shot region 8 conforms to the target shape. For example, as the optical elements included in the optical system of the heating unit, DMDs (digital micromirror devices), liquid crystal elements, and the like are used. Furthermore, the optical member 33 can include a beam splitter for transmitting light (ultraviolet rays) emitted by the exposure unit 31, and reflecting light (wavelength of 400 nm to 2,000 nm) emitted by the heating unit 32.

The resin supply unit 6 supplies (applies) the resin (uncured resin) onto the substrate. As described above, in the first embodiment, an ultraviolet-curing resin (imprint material) having a property that is cured upon ultraviolet irradiation is used. However, a resin to be supplied from the resin supply unit 6 onto the substrate can be appropriately selected under various conditions in semiconductor device manufacturing steps. Furthermore, the amount of a resin to be discharged from the discharge nozzle of the resin supply unit 6 can be appropriately decided in consideration of the thickness of the pattern to be formed on the resin on the substrate, the density of the pattern, and the like. To sufficiently fill the pattern formed on the mold 21 with the resin supplied onto the substrate, a given time may elapse while the mold and resin are in contact with each other.

Figure 2:
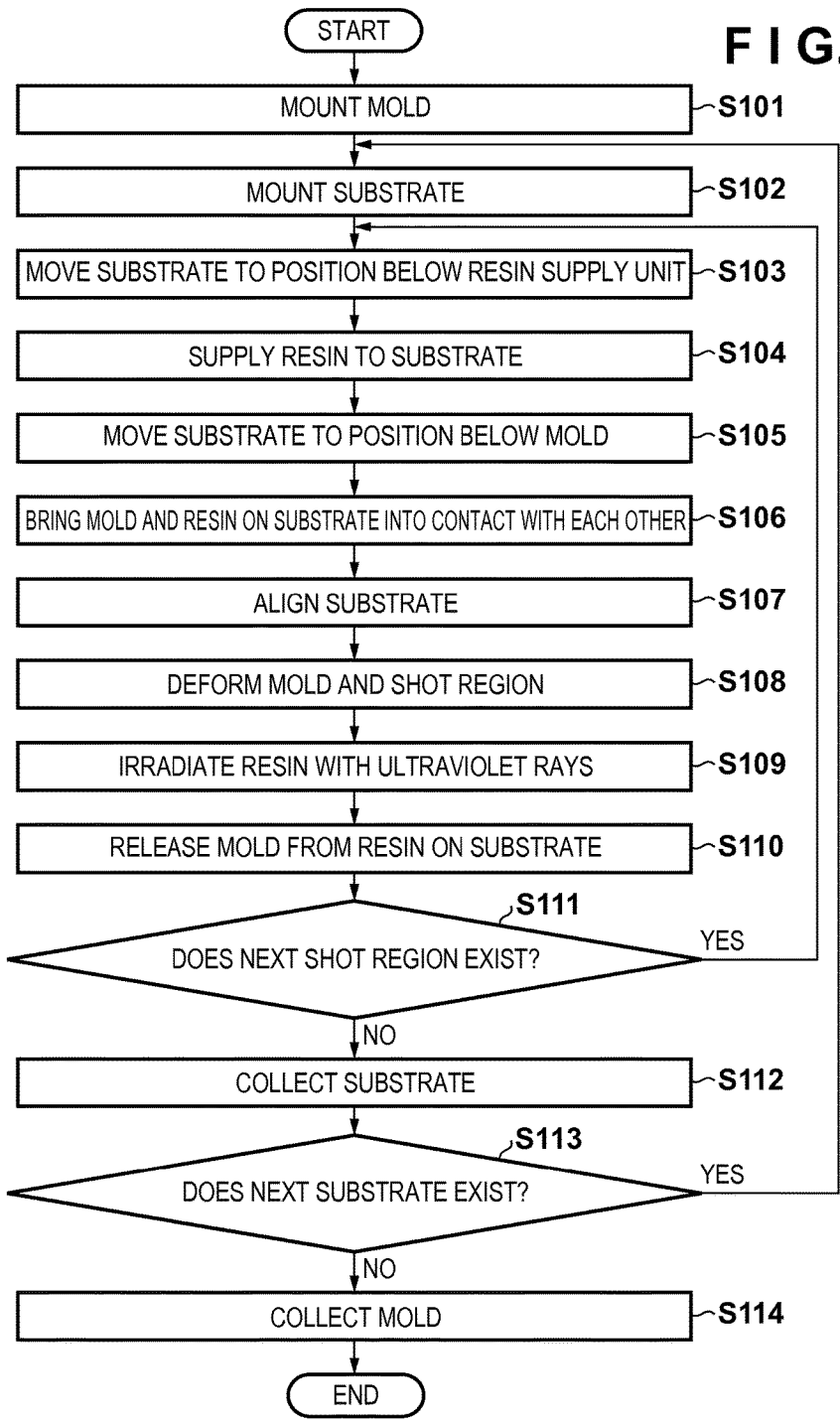
FIG. 2 is a flowchart illustrating an operation sequence in imprint processing.

Imprint processing of transferring the pattern of the mold 21 to the shot region 8 on the substrate in the imprint apparatus 100 having the above arrangement according to the first embodiment will be described with reference to FIG. 2. FIG. 2 is a flowchart illustrating an operation sequence in the imprint processing of transferring the pattern of the mold 21 to the shot region 8 on the substrate.

In step S101, the control unit 7 controls a mold conveyance mechanism (not shown) to convey the mold 21 to a position below the mold chuck 22, and controls the mold chuck 22 to hold the mold 21. This arranges the mold 21 within the imprint apparatus 100. In step S102, the control unit 7 controls a substrate conveyance mechanism (not shown) to convey the substrate 11 to a position above the substrate chuck 12, and controls the substrate chuck 12 to hold the substrate 11. This arranges the substrate 11 within the imprint apparatus 100. In step S103, the control unit 7 controls the stage driving unit 13 so that the shot region 8 on the substrate (the shot region 8 to undergo the imprint processing) is arranged below the resin supply unit 6, thereby moving the substrate 11. In step S104, the control unit 7 controls the resin supply unit 6 to supply the resin (uncured resin) to the shot region 8 on the substrate. In step S105, the control unit 7 controls the stage driving unit 13 so that the shot region 8 on the substrate, to which the resin is supplied, is arranged below the region 21a on the mold, thereby moving the substrate 11. In step S106, the control unit 7 controls the mold driving unit 23 to bring the pattern of the mold 21 and the resin on the substrate into contact with each other, that is, to shorten the distance between the substrate 11 and the mold 21.

In step S107, the control unit 7 controls the alignment Measurement unit 4 to measure the alignment mark formed in the shot region 8 and that formed on the mold 21. This allows the alignment measurement unit 4 to measure the shape difference between the shot region 8 on the substrate and the region 21a on the mold. The shape difference between the shot region 8 on the substrate and the region 21a on the mold may be acquired by measuring, in advance, the shape of the shot region 8 on the substrate and that of the region 21a on the mold. Alternatively, the measurement values obtained in advance and that obtained by the alignment measurement unit 4 may be used together. In step S108, the control unit 7 controls the deformation unit 24 and heating unit 32 so that the shape difference measured by the alignment measurement unit 4 falls within a tolerance range, and deforms the region 21a on the mold and the shot region 8 on the substrate. As described above, the deformation unit 24 corrects deformation in the region 21a on the mold by applying a force to each of the plurality of portions on the side surface of the mold 21. By using, as a target shape, the shape of the region 21a on the mold, which has been corrected by the deformation unit 24, the heating unit 32 deforms the shot region 8 so that the shape of the shot region 8 on the substrate conforms to the target shape. This makes it possible to set the shape difference between the region 21a on the mold and the shot region 8 to fall within the tolerance range, thereby accurately transferring the pattern of the mold 21 to the shot region 8. Deformation of the shot region 8 by the heating unit 32 will be described in detail later. Note that a measurement step in step S107 by the alignment measurement unit 4 and a step of deforming the mold 21 in step S108 may be performed before a step (step S106) of bringing the mold 21 and the resin on the substrate into contact with each other. Furthermore, the measurement step by the alignment measurement unit 4 may be performed between the step of deforming the mold 21 and the step of deforming the shot region 8 in step S108.

In step S109, the control unit 7 controls the exposure unit 31 to irradiate, with ultraviolet rays, the resin which is in contact with the mold 21, thereby curing the resin. In step S110, the control unit 7 controls the mold driving unit 23 so as to separate (release) the mold 21 from the resin on the substrate, that is, to increase the distance between the substrate 11 and the mold 21. In step S111, the control unit 7 determines whether there exists a shot region 8 (next shot region 8) on the substrate, to which the pattern of the mold 21 is to be subsequently transferred. If there exists a next shot region 8, the process returns to step S103; otherwise, the process advances to step S112. In step S112, the control unit 7 controls the substrate conveyance mechanism (not shown) to collect the substrate 11 from the substrate chuck 12. In step S113, the control unit 7 determines whether there exists a substrate 11 (next substrate 11) for which the imprint processing is to be subsequently performed. If there exists a next substrate 11, the process returns to step S102; otherwise, the process advances to step S114. In step S114, the control unit 7 controls the mold conveyance mechanism (not shown) to collect the mold 21 from the mold chuck 22.

Deformation of the shot region 8 by the heating unit 32 will now be explained. As described above, deformation including components such as a magnification component, trapezoid component, and barrel component may have occurred in the shot region 8 on the substrate due to the influence of a series of semiconductor device manufacturing steps and the like. In this case, to accurately transfer the pattern of the mold 21 to the shot region 8 on the substrate, it is necessary to deform the shot region 8 so that its shape conforms to the target shape. To do this, the imprint apparatus 100 of the first embodiment includes the heating unit 32 which applies heat by irradiating, with light, each of a plurality of portions included in the shot region 8, and deforms the shot region by thermal expansion in each portion. The heating unit 32 applies heat to each portion of the shot region 8 based on the heating profile decided by the control unit 7. This makes it possible to obtain a temperature distribution in the shot region 8, and make the shape of the shot region 8 conform to the target shape. Note that the heating profile is a profile indicating the relationship between the time and a heat quantity per unit time (to be referred to as a heat flow hereinafter) to be applied to one portion. A method of generating a heating profile will be described later. Furthermore, as described above, in the first embodiment, the control unit 7 uses, as the target shape of the shot region 8, the shape of the region 21a on the mold, which has been deformed by the deformation unit 24. Also, although the plurality of portions are all included in the shot region 8 in the first embodiment, the present invention is not limited to this and a portion arranged outside the shot region 8 may be included.

If, for example, deformation including only a magnification component has occurred in the shot region 8, a heating profile is generated for each portion of the shot region 8 so that the temperature of the shot region becomes uniform. It is possible to deform the shot region 8 so that its shape conforms to the target shape when the heating unit 32 applies heat to each portion of the shot region 8 according to the generated heating profile. On the other hand, if deformation including only a trapezoid component has occurred in the shot region 8, a heating profile is generated for each portion of the shot region 8 so that the temperature of the shot region 8 linearly lowers in one direction. It is possible to deform the shot region 8 so that its shape conforms to the target shape when the heating unit 32 applies heat to each portion according to the generated heating profile. There is also a case in which deformation including a magnification and trapezoid components has occurred in the shot region 8. In this case, a heating profile is generated for each portion of the shot region 8 by adding a heating profile for correcting deformation of the magnification component and that for correcting deformation of the trapezoid component. The heating unit 32 then applies heat to each portion of the shot region 8 according to the added heating profile. This can deform the shot region 8 so that its shape including the magnification and trapezoid components conforms to the target shape.

Figure 3:
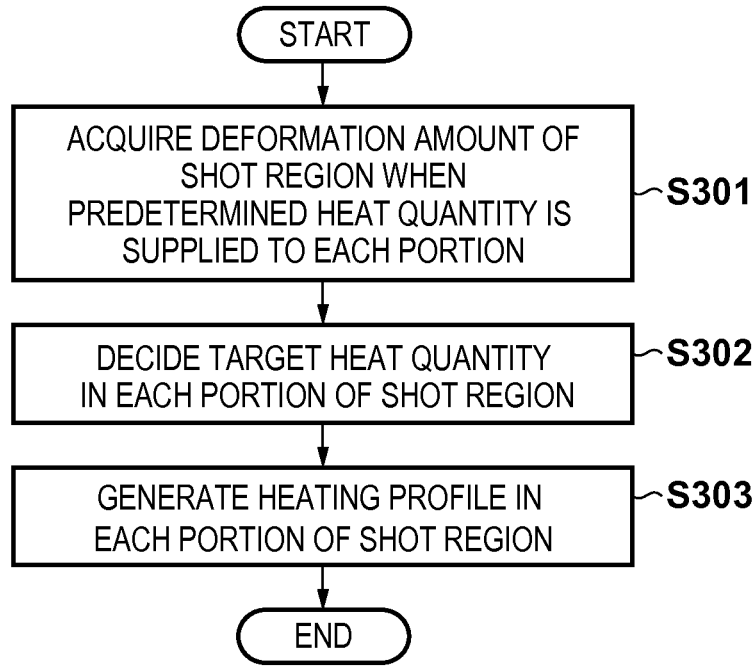
FIG. 3 is a flowchart illustrating a method of generating a heating profile.
Figure 4:
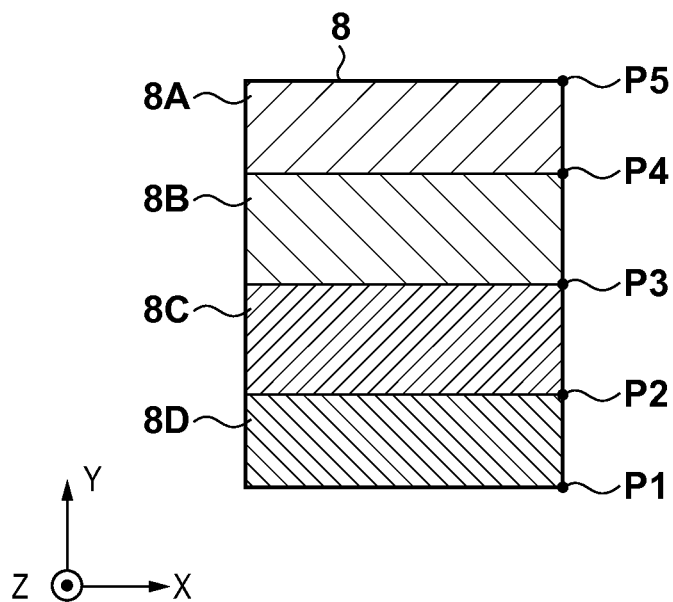
FIG. 4 is a view showing a shot region on a substrate.

As an example, a method of generating a heating profile when deformation including only a trapezoid component has occurred in the shot region 8 will be described with reference to FIG. 3. FIG. 3 is a flowchart illustrating a method of generating a heating profile by the control unit 7. The shot region 8 includes a plurality of portions which are individually applied with heat by the heating unit 32. For the sake of simplicity, assume that the shot region 8 includes four portions 8A to 8D, as shown in FIG. 4.

Figure 5:
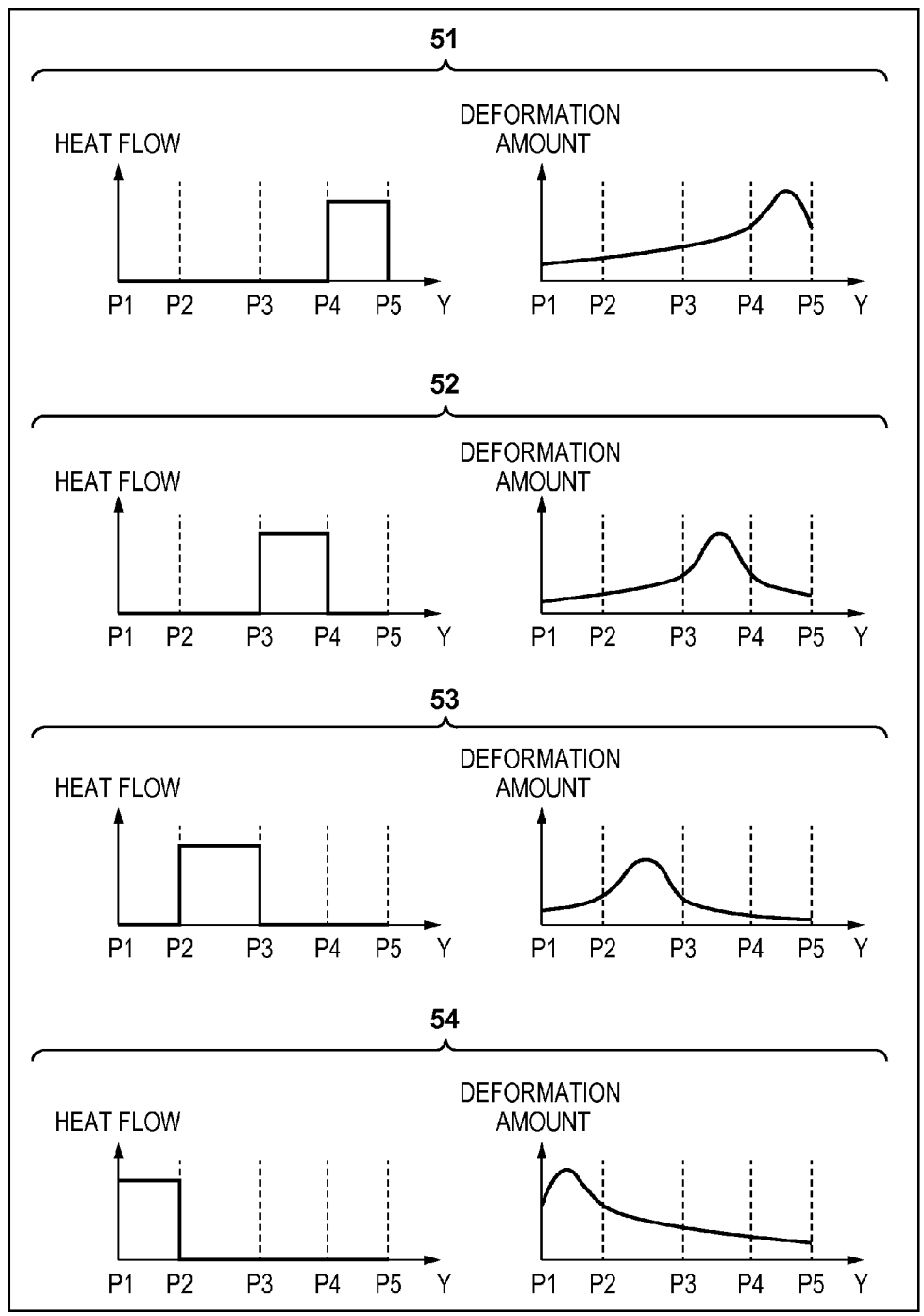
FIG. 5 is a view showing a predetermined heat quantity supplied to each portion of the shot region and the deformation amount of the shot region when the predetermined heat quantity is supplied to the portion.

In step S301, the control unit 7 supplies a predetermined heat quantity to each of the portions 8A to 8D of the shot region 8, and acquires the deformation amount of the shot region 8 at that time. FIG. 5 shows the predetermined heat quantity supplied to each of the portions 8A to 8D of the shot region 8, and the deformation amount of the shot region 8 when the predetermined heat quantity is supplied to each of the portions 8A to 8D. Referring to FIG. 5, the abscissa represents positions P1 to P5 on the right-side (lines P1 to P5) of the shot region 8 shown in FIG. 4. In FIG. 5, 51 shows the predetermined heat quantity supplied to the portion 8A of the shot region 8 (a left graph) and the deformation amount of the shot region 8 at that time (a right graph), and 52 shows the predetermined heat quantity supplied to the portion 8B of the shot region 8 (a left graph) and the deformation amount of the shot region 8 at that time (a right graph). Similarly, 53 of FIG. 5 shows the predetermined heat quantity supplied to the portion 8C of the shot region 8 (a left graph) and the deformation of the shot region 8 at that time (a right graph), and 54 of FIG. 5 shows the predetermined heat quantity supplied to the portion 8D of the shot region 8 (a left graph) and the deformation of the shot region 8 at that time (a right graph). The deformation amount of the shot region 8 can be obtained by, for example, experiment or simulation, and can be acquired by the control unit 7 as a database or function. The predetermined heat quantities supplied to the portions 8A to 8D of the shot region 8 are preferably equal to each other in the portions 8A to 8D, and their magnitudes are arbitrarily settable.

Figure 6:
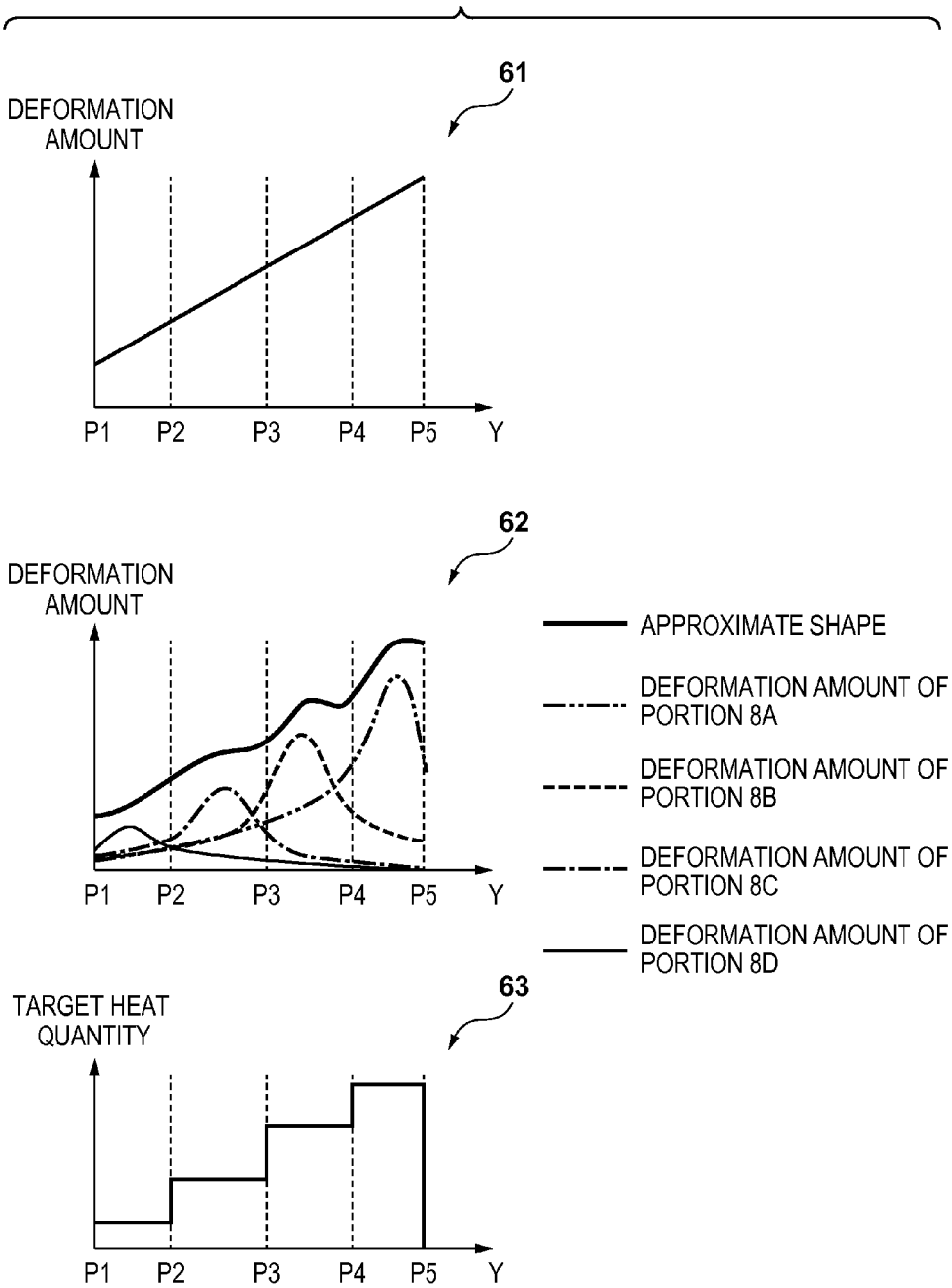
FIG. 6 is a view for explaining a method of deciding a target heat quantity in each portion of the shot region.

In step S302, the control unit 7 decides (obtains) target heat quantities in the respective portions 8A to 8D of the shot region 8 using the deformation amounts of the shot region 8 acquired in step S301. Assume, for example, that the lines P1 to P5 of the shot region 8 shown in FIG. 4 are changed so that the deformation amount linearly increases along the Y direction, as shown in 61 of FIG. 6. That is, the function shown in 61 of FIG. 6 serves as the target shape of the lines P1 to P5 of the shot region 8 shown in FIG. 4. At this time, the control unit 7 approximates the shape of the lines P1 to P5 of the shot region 8, as indicated by a thick line in 62 of FIG. 6, by multiplying each of the deformation amounts (the right graphs of 51 to 54 of FIG. 5) of the shot region 8 acquired in step S301 by a coefficient, and combining the results (linear combination). The control unit 7 decides a coefficient which makes the approximated shape (approximate shape) of the lines P1 to P5 of the shot region 8 closer to the target shape, and multiplies each predetermined heat quantity by the decided coefficient. This enables the control unit 7 to decide a target heat quantity in each of the portions 8A to 8D of the shot region 8, as shown in 63 of FIG. 6.

In step S303, the control unit 7 generates a heating profile in each of the portions 8A to 8D of the shot region 8 using the target heat quantity in each of the portions 8A to 8D of the shot region 8, which has been decided in step S302. The heating profile indicates the relationship between the time and the heat flow (the heat quantity per unit time) applied to each of the portions 8A to 8D, as described above. When the heating unit 32 applies heat to each of the portions 8A to 8D according to the heating profile, it is possible to make the heat quantity in each of the portions 8A to 8D closer to the corresponding target heat quantity. That is, it is possible to make the shape of the shot region 8 closer to the target shape. Examples of the method of generating a heating profile are a method of generating a heating profile by setting the time, during which the heating unit 32 applies heat, to be constant for the portions 8A to 8D, and a method of generating a heating profile by setting the heat-flow applied by the heating unit 32 to be constant for the portions 8A to 8D. Both the methods will be explained below.

The method of generating a heating profile by setting the time, during which the heating unit 32 applies heat, to be constant for the portions 8A to 8D will be described first. This method is a method of generating a heating profile by fixing time t1 when the heating unit 32 starts heating and time t2 when the heat quantity reaches the target heat quantity, and changing the heat flow applied by the heating unit 32 during a period from time t1 to time t2, as shown in 71 of FIG. 7. Time t2 indicates, for example, the time when curing the resin on the substrate starts, that is, the time when irradiation of the resin with ultraviolet rays starts. The control unit 7 decides a heat flow Q1 to be applied to the portion 8A by the heating unit 32 so that a value (the heat quantity of the portion 8A) obtained by integrating, from time t1 to time t2, the heat flow Q1 to be applied to the portion 8A by the heating unit 32 becomes equal to the target heat quantity decided in step S302. This enables the control unit 7 to generate a heating profile in the portion 8A of the shot region 8, as shown in 81 of FIG. 8. Furthermore, the control unit 7 decides a heat flow Q2 to be applied to the portion 8B by the heating unit 32 so that a value (the heat quantity of the portion 8B) obtained by integrating, from time t1 to time t2, the heat flow Q2 to be applied to the portion 8B by the heating unit 32 becomes equal to the target heat quantity decided in step S302. This enables the control unit 7 to generate a heating profile in the portion 8B of the shot region 8, as shown in 82 of FIG. 8. Similarly, the control unit 7 decides a heat flow Q3 to be applied to the portion 8C by the heating unit 32 and a heat flow Q4 to be applied to the portion 8D by the heating unit 32. This enables the control unit 7 to generate heating profiles in the portions 8C and 8D of the shot region 8, as shown in 83 and 84 of FIG. 8.

Referring to FIG. 8, 85 shows the sum of the heating profiles in the portions 8A to 8D of the shot region 8, that is, a heating profile representing the relationship between the time and a heat flow applied to the entire shot region 8 by the heating unit 32. In FIG. 8, $Q_{total}$ shown in 85 indicates the total value of the heat flows Q1 to Q4 respectively applied to the portions 8A to 8D. When the heating unit 32 applies heat to the shot region 8 according to the heating profile shown in 85 of FIG. 8, the average value (to be referred to as an average temperature hereinafter) of the temperature of the shot region 8 starts to rise at time t1, as shown in 86 of FIG. 8. If a heating time (a period from time t1 to time t2) is shorter than the time constant of a change in average temperature, the average temperature of the shot region 8 linearly changes. When the average temperature of the shot region 8 rises as shown in 86 of FIG. 8, the shot region 8 (lines P1 to P5) starts to deform at time t1, as shown in 87 of FIG. 8. Immediately after time t1, heat stress generated according to a change in temperature of the shot region 8 is smaller than frictional force generated between the substrate 11 and the substrate chuck 12, and thus the shot region 8 slowly deforms, as shown in 87 of FIG. 8. After time t3, the heat stress generated in the shot region 8 is larger than the frictional force, and thus the shot region 8 largely deforms. That is, at time t3, the frictional force and the heat stress generated in the shot region 8 become equal to each other. The change rates of the deformation amount of the shot region 8 before and after time t3 are different from each other. The imprint apparatus 100 of the first embodiment decides heating profiles in the respective portions 8A to 8D using the deformation amounts of the shot region 8 acquired in step S301, and can obtain the deformation amounts by experiment or the like. Even if, therefore, the change rates of the deformation amount of the shot region before and after time t3 are different from each other, the control unit 7 can decide heating profiles of the respective portions 8A to 8D so that the shape of the shot region 8 conforms to a target shape A.

Figure 9:
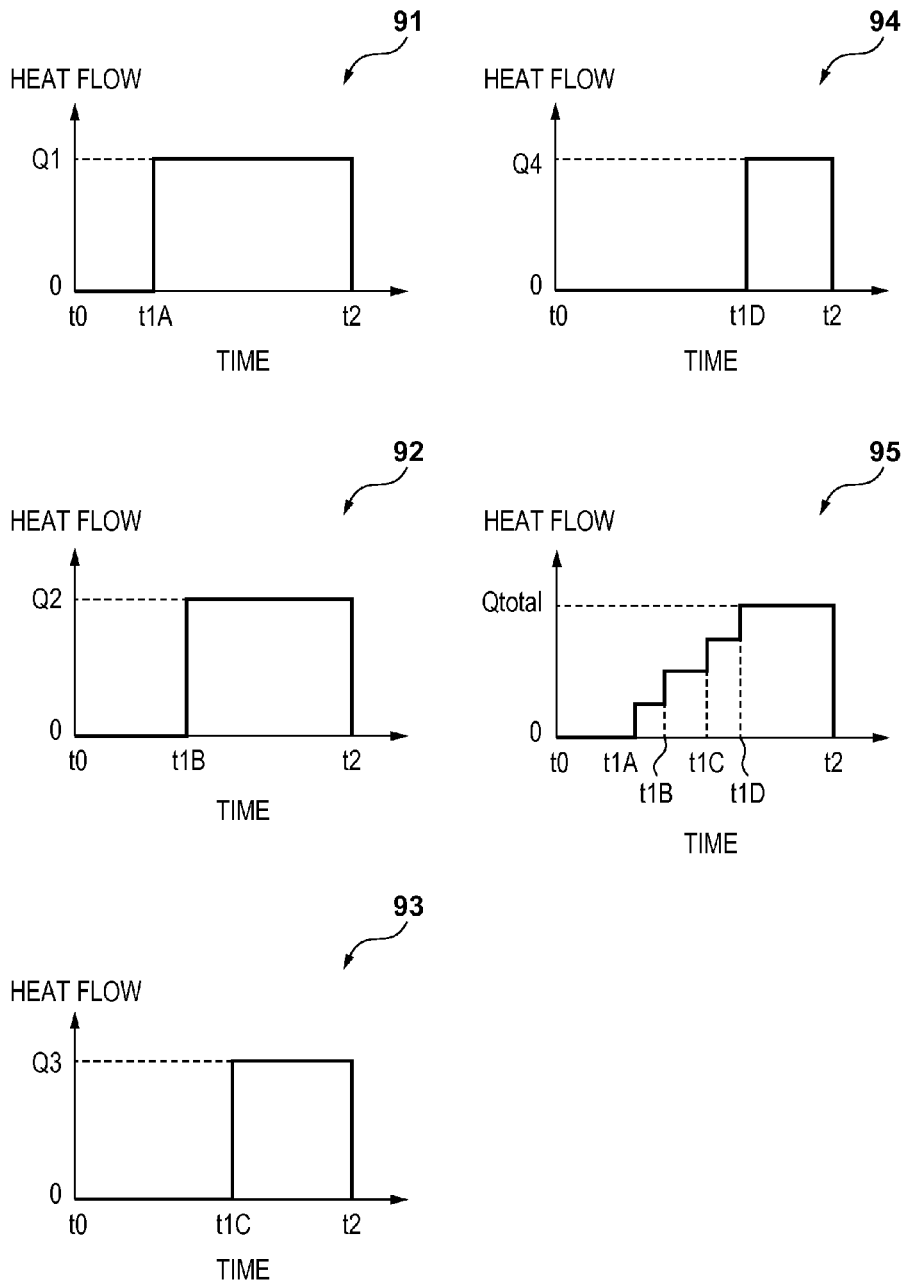
FIG. 9 is a view showing an example of the heating profiles in the respective portions of the shot region.

The method of generating a heating profile by setting a heat flow applied by the heating unit 32 to be constant for the portions 8A to 8D will be described next. This method is a method of generating a heating profile by fixing a heat flow Q applied by the heating unit 32, and changing time t1 when the heating unit 32 starts heating, as shown in 72 of FIG. 7. As described above, time t2 indicates, for example, the time when curing the resin on the substrate starts (ultraviolet irradiation starts). The control unit 7 sets the heat flow Q1 to be applied to the portion 8A by the heating unit 32, and decides time t1A so that a value (the heat quantity of the portion 8A) obtained by integrating the heat flow Q1 from time t1A to time t2 becomes equal to the target heat quantity decided in step S302. This enables the control unit 7 to generate a heating profile in the portion 8A of the shot region 8, as shown in 91 of FIG. 9. Furthermore, the control unit 7 sets the heat flow Q2 to be applied to the portion 8B by the heating unit 32, and decides time t1B so that a value (the heat quantity of the portion 8B) obtained by integrating the heat flow Q2 from time t1B to time t2 becomes equal to the target heat quantity decided in step S302. This enables the control unit 7 to generate a heating profile in the portion 8B of the shot region 8, as shown in 92 of FIG. 9. Similarly, the control unit 7 sets the heat flow Q3 to be applied to the portion 8C by the heating unit 32 and the heat flow Q4 to be applied to the portion 8D by the heating unit 32, and decides times t1C and t1D. This enables the control unit 7 to generate heating profiles in the portions 8C and 8D of the shot region 8, as shown in 93 and 94 of FIG. 9. Referring to FIG. 9, 95 shows the sum of the heating profiles in the portions 8A to 8D of the shot region 8, that is, a heating profile representing the relationship between the time and a heat flow applied to the entire shot region 8 by the heating unit 32. In FIG. 9, $Q_{total}$ shown in 95 indicates the total value of the heat flows Q1 to Q4 respectively applied to the portions 8A to 8D. In the heating profile shown in 95 of FIG. 9, the heat flow applied to the shot region 8 changes stepwise at times t1A to t1D. Note that the heat flows Q1 to Q4 respectively applied to the portions 8A to 8D by the heating unit 32 may be set to have different magnitudes or the same magnitude.

As described above, the imprint apparatus 100 of the first embodiment includes the heating unit 32 for deforming the shot region 8 by applying heat to each of the plurality of portions included in the shot region 8. When the control unit 7 generates a heating profile in each portion, and the heating unit 32 applies heat to each portion of the shot region 8 according to the generated heating profile, it is possible to make the shape of the shot region 8 closer to the target shape. Therefore, the imprint apparatus 100 of the first embodiment can set the difference between the shape of the shot region 8 and that of the region 21a on the mold to fall within the tolerance range, thereby accurately transferring the pattern of the mold to the shot region 8. Note that the heating profile may be generated to perform PWM (Pulse Width Modulation) control for heating of each portion by the heating unit 32, as shown in 73 of FIG. 7.

Second Embodiment

An imprint apparatus according to the second embodiment of the present invention will be described. The imprint apparatus 100 according to the first embodiment causes the control unit 7 to generate a heating profile so that the heating unit 32 deforms the shot region 8 until time t2 when curing the resin on the substrate starts. On the other hand, in the imprint apparatus according to the second embodiment, deformation of a shot region 8 by a heating unit 32 is complete before time t2, and a control unit 7 generates a heating profile so as to keep the deformed shape of the shot region 8 until time t2. That is, in the imprint apparatus of the second embodiment, the heating profile generated by the control unit 7 includes a range within which heat is applied to the shot region 8 so as to keep a state in which the difference between a target shape and the deformed shape of the shot region 8 falls within a tolerance range. By keeping the deformation of the shot region 8 in this way, it is possible to cure a resin on a substrate when the contact state between the pattern of a mold 21 and the resin on the substrate becomes stable. The following description assumes that time t4 indicates the time when deformation of the shot region 8 by the heating unit 32 is complete, deformation of the shot region 8 is in progress during a period from time t1 to time t4, and the shape of the shot region 8 is kept during a period from time t4 to time t2. Note that the imprint apparatus of the second embodiment has the same apparatus arrangement as that of the imprint apparatus 100 of the first embodiment, and a description thereof will be omitted.

Figure 10:
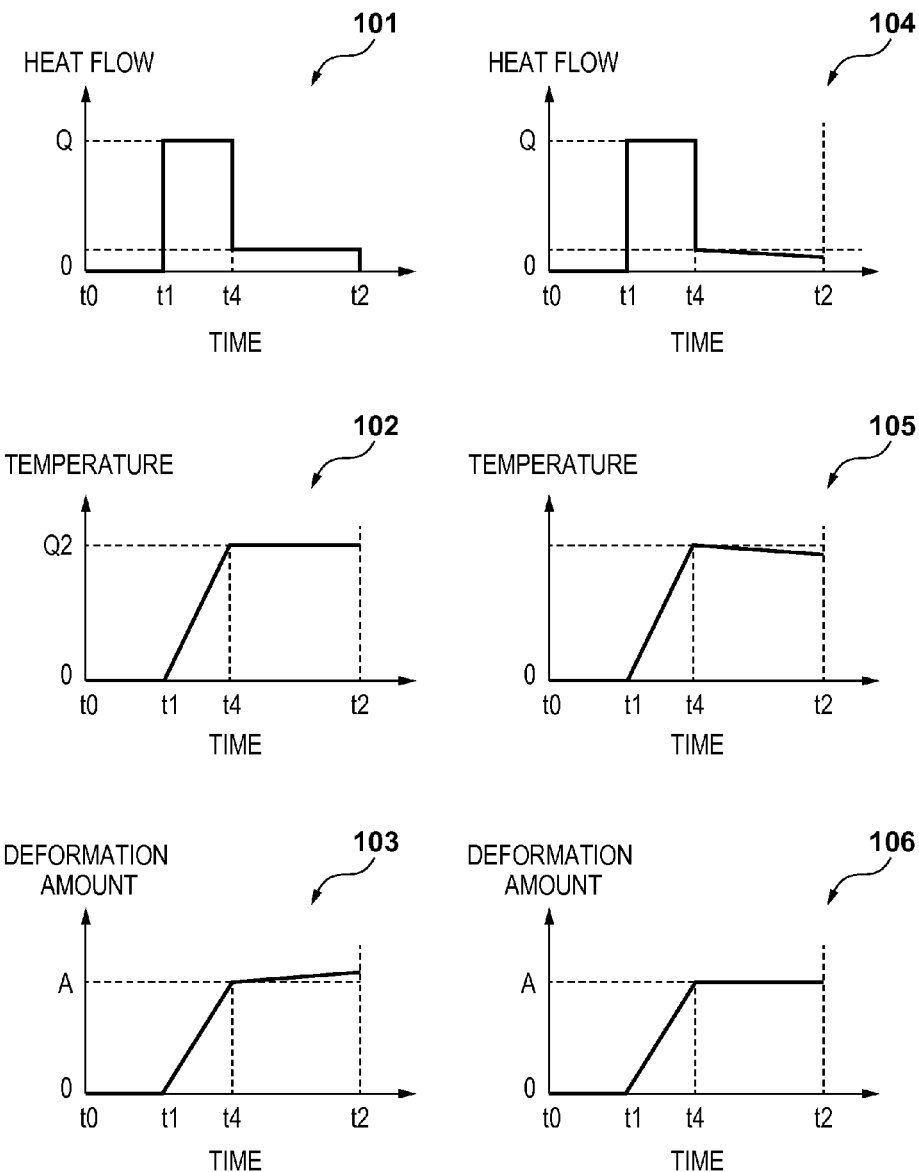
FIG. 10 is a view for explaining heating profiles according to the second embodiment.

Assume, for example, that a heating profile is generated so that a heat flow (a heat quantity per unit time) applied to the shot region 8 by the heating unit 32 during the period from time t4 to time t2 becomes constant, as shown in 101 of FIG. 10. When the heating unit 32 applies heat to the shot region 8 according to the heating profile shown in 101 of FIG. 10, the temperature (average temperature) of the shot region 8 becomes constant during the period from time t4 to time t2, as shown in 102 of FIG. 10. Note that a heat flow applied to the shot region 8 by the heating unit 32 during the period from time t4 to time t2, for example, can be set to be equal to the amount of heat flowing from the shot region 8. The heat flowing from the shot region 8 includes, for example, thermal diffusion within a substrate 11, heat transferred from the substrate 11 to a fluid such as air, heat transferred from the substrate 11 to the mold 21 via the resin, and heat transferred from the substrate 11 to a substrate chuck 12. Therefore, the heat flowing from the shot region 8 is calculated in consideration of the above kinds of heat, the temperature of the shot region 8 (a heat quantity until time t4), and the like.

Even if, however, the temperature of the shot region 8 can be set to be constant, the heat flowing from the shot region 8 unwantedly raises the temperature around the shot region 8 within the substrate 11. If the temperature around the shot region 8 rises, the heat stress around the shot region 8 can change, and the shape of the shot region 8 can change with time, as shown in 103 of FIG. 10. To solve this problem, the imprint apparatus of the second embodiment causes the control unit 7 to generate a heating profile so that a heat flow Q applied to the shot region 8 by the heating unit 32 decreases with time during the period from time t4 to time t2, as shown in 104 of FIG. 10. When the heating unit 32 applies heat to the shot region 8 according to the thus generated heating profile (104 of FIG. 10), the temperature (average temperature) of the shot region 8 lowers with time during the period from time t4 to time t2, as shown in 105 of FIG. 10. On the other hand, the shape of the shot region 8 can be set constant during the period from time t4 to time t2, as shown in 106 of FIG. 10. That is, it is possible to keep the shape of the shot region 8. The decrease rate of the heat flow Q during the period from time t4 to time t2 can be acquired by, for example, experiment or simulation.

An example of a method of generating a heating profile in each of portions 8A to 8D of the shot region 8 will be explained. The imprint apparatus of the second embodiment causes the control unit 7 to generate a heating profile in each of the portions 8A to 8D according to the flowchart shown in FIG. 3, similarly to the imprint apparatus 100 of the first embodiment. In the second embodiment, a method (step S303 of FIG. 3) of generating a heating profile in each of the portions 8A to 8D of the shot region 8 is different from that in the first embodiment, and will be described. A method of generating a heating profile by setting a heat flow applied by the heating unit 32 to be constant for the portions 8A to 8D will also be described.

Figure 11:
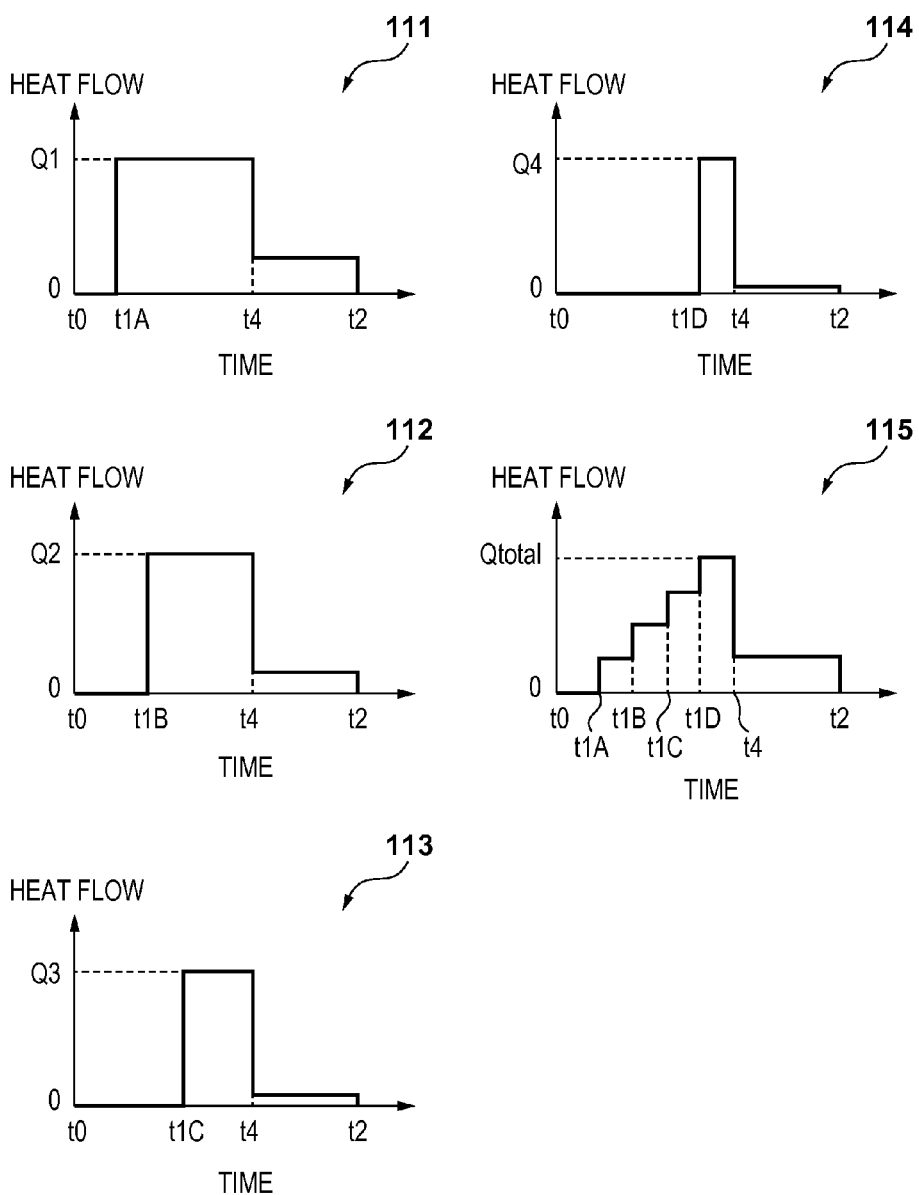
FIG. 11 is a view showing an example of heating profiles in respective portions of a shot region.

The control unit 7 fixes the heat flow Q applied by the heating unit 32, and changes time t1 when the heating unit 32 starts heating, thereby generating a heating profile. As described above, time t4 indicates the time when deformation of the shot region 8 by the heating unit 32 is complete, and is arbitrarily settable. The control unit 7 sets a heat flow Q1 to be applied to the portion 8A by the heating unit 32, and decides time t1A so that a value obtained by integrating the heat flow Q1 from time t1A to time t4 becomes equal to a target heat quantity decided in step S302. The control unit 7 then decides a profile during the period from time t4 to time t2. This profile can be decided by calculating a heat flow flowing from the shot region 8 as a heat flow Q1m applied by the heating unit 32 at time t4, and decreasing the heat flow Q1m at the decrease rate acquired in advance. This enables the control unit 7 to generate a heating profile in the portion 8A of the shot region 8, as shown in 111 of FIG. 11. Furthermore, the control unit 7 sets a heat flow Q2 to be applied to the portion 8B by the heating unit 32, and decides time t1B so that a value obtained by integrating the heat flow Q2 from time t1B to time t4 becomes equal to a target heat quantity decided in step S302. The control unit 7 then decides a profile during the period from time t4 to time t2. This enables the control unit 7 to generate a heating profile in the portion 8B of the shot region 8, as shown in 112 of FIG. 11. Similarly, the control unit 7 sets a heat flow Q3 to be applied to the portion 8C by the heating unit 32 and a heat flow Q4 to be applied to the portion 8D by the heating unit 32, and decides times t1C and t1D. The control unit 7 then decides profiles during the period from time t4 to time t2. This enables the control unit 7 to generate heating profiles in the portions 8C and 8D of the shot region 8, as shown in 113 and 114 of FIG. 11. Referring to FIG. 11, 115 shows the sum of the heating profiles in the portions 8A to 8D of the shot region 8, that is, a heating profile representing the relationship between the time and a heat flow applied to the entire shot region 8 by the heating unit. In FIG. 11, $Q_{total}$ shown in 115 indicates the total value of the heat flows Q1 to Q4 respectively applied to the portions 8A to 8D. In the heating profile shown in 115 of FIG. 11, the heat flow applied to the shot region 8 changes stepwise at times t1A to t1D. Note that the heat flows Q1 to Q4 respectively applied to the portions 8A to 8D by the heating unit 32 may be set to have different magnitudes or the same magnitude.

Figure 12:
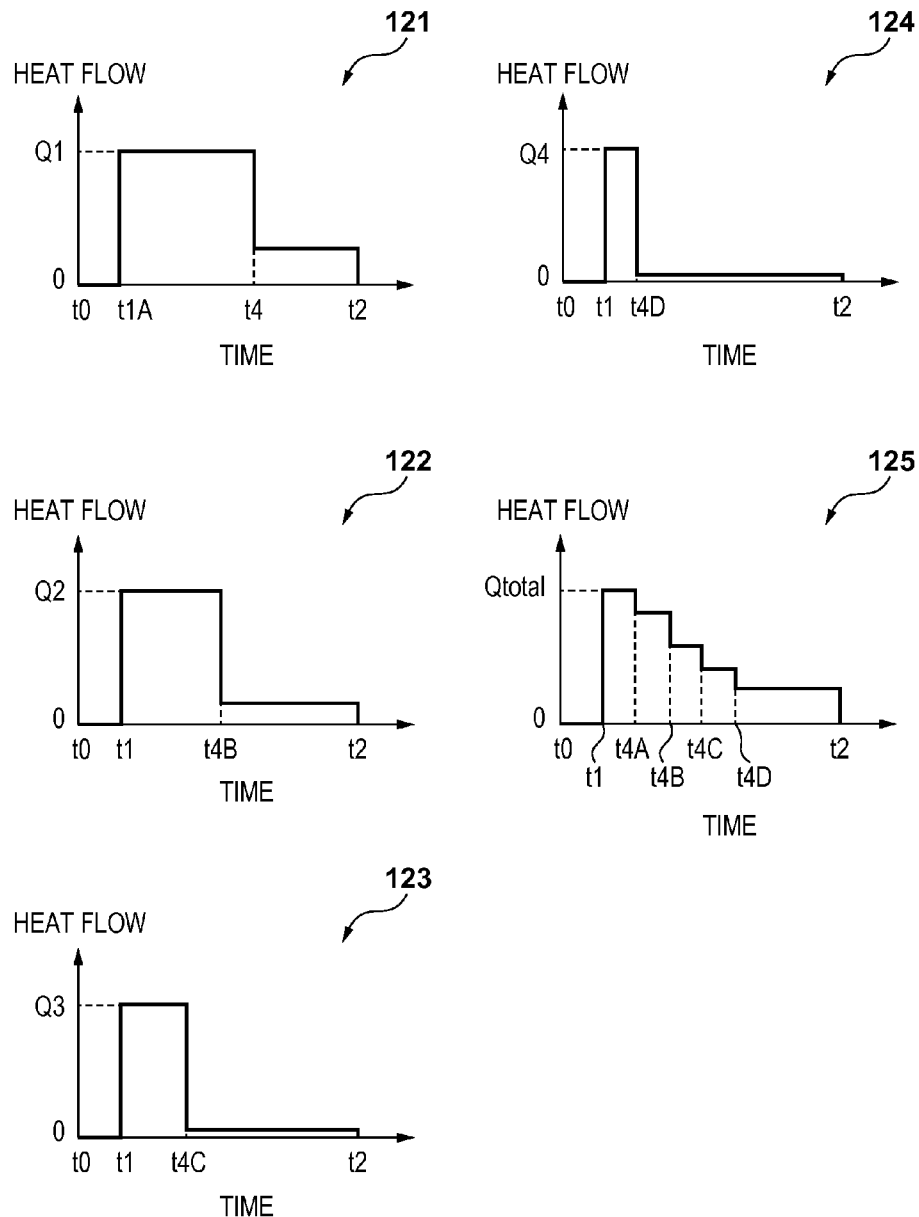
FIG. 12 is a view showing an example of the heating profiles in the respective portions of the shot region.

Furthermore, the control unit 7 may fix the heat flow Q applied by the heating unit 32, and change time t4 when deformation of the shot region 8 by the heating unit 32 is complete, thereby generating a heating profile. In this case, the control unit 7 can generate heating profiles in the portions 8A to 8D of the shot region 8, as shown in 121 to 124 of FIG. 12. Referring to FIG. 12, 125 shows the sum of the heating profiles in the portions 8A to 8D of the shot region 8, that is, a heating profile indicating the relationship between the time and a heat flow applied to the entire shot region 8 by the heating unit.

As described above, in the imprint apparatus of the second embodiment, the heating profile generated by the control unit 7 includes a range within which heat is applied to the shot region 8 so as to keep the deformed shape of the shot region. The heating profile is generated so that a heat flow applied to the shot region 8 within the range decreases with time. When the heating unit 32 applies heat to the shot region 8 according to the thus generated heating profile, it is possible to keep a state in which the difference between the target shape and the shape of the shot region 8 falls within the tolerance range. This makes it possible to cure the resin on the substrate when the contact state between the pattern of the mold 21 and the resin on the substrate becomes stable.

Third Embodiment

An imprint apparatus according to the third embodiment of the present invention will be described. The imprint apparatus 100 according to the first embodiment generates a heating profile so that the shot region 8 deformed by the heating unit 32 conforms to the target shape of the region 21a on the mold. On the other hand, an imprint apparatus according to the third embodiment uses a heating unit 32 and a deformation unit 24 together. Note that the imprint apparatus of the third embodiment has the same apparatus arrangement as that of the imprint apparatus 100 of the first embodiment, and a description thereof will be omitted.

A control unit 7 acquires pattern shape information (including a low-order component and a high-order component as much as possible) of a substrate pertaining to the shape difference between each shot region on a substrate 11 and a region 21a on a mold 21 simultaneously with or before conveyance of the substrate in step S102. For example, the pattern shape information is obtained as a result of performing imprint processing by the imprint apparatus for a test substrate different from a substrate on which a pattern is actually formed, and performing an overlay inspection. This is because it is possible to acquire the shape difference between a shot region on the test substrate and the region on the mold by using the result of the overlay inspection since the region on the mold is imprinted on (transferred to) the shot region on the test substrate. The same pattern shape information may be used for a plurality of substrates. If, for example, one lot is managed by 25 substrates, the same pattern shape information may be used for the substrates of one lot. This is because it is not preferable to perform an overlay inspection for all the substrates in terms of the cost and productivity.

The control unit 7 generates a heating profile for the heating unit 32 and a control amount for the deformation unit 24 based on the acquired pattern shape information. If, for example, a piezoelectric element is used as the deformation unit 24, the control amount of the deformation unit 24 indicates a driving amount, driving force, voltage, current, or the like. A method of generating a heating profile is almost the same as that in the first embodiment except that the heating profile of the heating unit 32 and the control amount of the deformation unit 24 are generated at the same time. Similarly to the deformation amount of a shot region 8 obtained by heating each heating region shown in FIG. 5, the control unit 7 also acquires a function or database indicating the deformation amount of the region 21a on the mold 21 with respect to the unit control amount of each deformation mechanism of the deformation unit 24. The control unit 7 decides the target heat quantity of each heating region and the control amount of each deformation mechanism of the deformation unit 24 so as to reduce the shape difference by using the pattern shape information as a target shape. A method of generating a heating profile after deciding the target heat quantity is the same as that in the first embodiment. As shown in 71 of FIG. 7, for example, the amount of a heat flow Q for heating the substrate by the heating unit 32 is decided so that the heat quantity of the substrate by the heating unit 32 becomes equal to a target heat quantity. The control unit 7 causes the heating unit 32 to heat the substrate based on the generated heating profile. The control unit 7 also controls the deformation unit 24 based on the decided control amount. The deformation unit 24 may be driven before or after the mold 21 and a resin on the substrate 11 are brought into contact with each other, or may be driven during heating by the heating unit 32.

Figure 13:
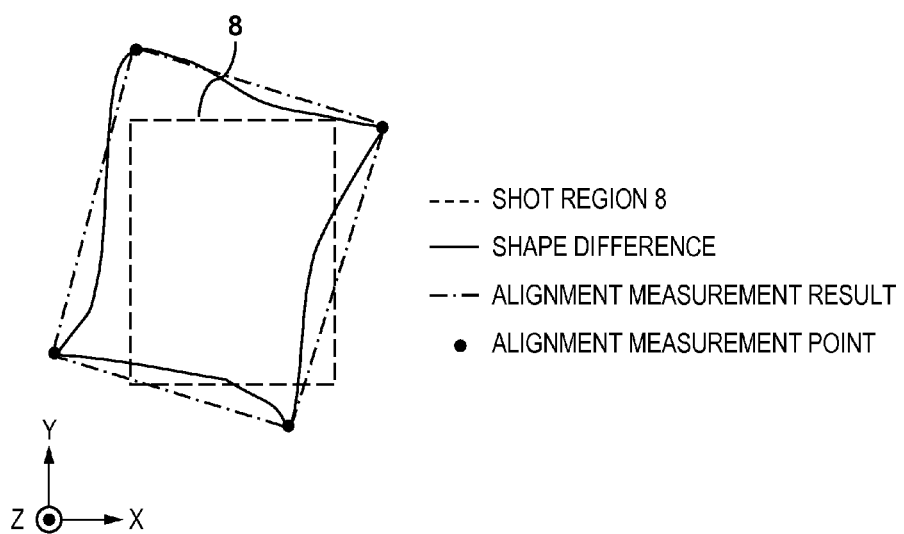
FIG. 13 is a view showing an example of alignment measurement.

An alignment measurement unit 4 acquires the shape difference between the shot region 8 and the region 21a on the mold 21. The shape difference between the shot region 8 and the region 21a on the mold 21, which has been measured by the alignment measurement unit 4, will be referred to as an alignment measurement result hereinafter. Note that the alignment measurement unit 4 performs measurement at about 2 to 9 points in the shot region. As shown in FIG. 13, for example, alignment measurement is performed at the four corner points of the shot region 8. With respect to an actual shape difference indicated by solid lines, therefore, the alignment measurement result indicated by one-dot dashed lines includes only low-order components such as a shift component and rotation component.

Although the heating profile of the heating unit 32 and the control amount of the deformation unit 24 have already been decided based on the pattern shape information, the control amount of the deformation unit 24 is modified using the alignment measurement result. The heating profile of the heating unit 32 may also be modified based on the alignment measurement result. Since, however, the alignment measurement result includes only a low-order shape, only the deformation unit 24 may correct the region on the mold. Since mechanical deformation by the deformation unit 24 has responsiveness higher than that of thermal deformation by the heating unit 32, correction by the deformation unit 24 is more easily made to follow the alignment measurement result.

If the same pattern shape information is used for a plurality of substrates, the shot shape difference between the substrates becomes an error, thereby degrading the transfer accuracy. Since the alignment measurement unit 4 performs alignment measurement in all shots, it is possible to correct the shot shape difference between the substrates. Note that as described above, the alignment measurement result includes only low-order deformation, and thus includes shape information less than that of the pattern shape information including high-order information. Since the pattern shape information is based on the overlay inspection, the number of measurement points is generally 10 or more, and it is possible to obtain a larger number of measurement points than in measurement by the alignment measurement unit. In other words, a rough shape which is common to the plurality of substrates and includes high-order components is corrected using the pattern shape information, and the low-order variation components of each shot are additionally corrected using the alignment measurement result.

With the above processing, it is possible to improve at least one of the overlay accuracy and productivity.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin applied on a substrate (a step of performing imprint processing on the substrate) by using the above-described imprint apparatus, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest-interpretation so as to encompass all such modifications and equivalent structures and functions.

This application claims the benefit of Japanese Patent Application Nos. 2013-102597 filed on May 14, 2013 and 2014-083998 filed on Apr. 15, 2014, which are hereby incorporated by reference herein in their entirety.

What is claimed is:

1. An imprint apparatus for forming a pattern of an imprint material on a shot region of a substrate by curing the imprint material on the shot region while a mold and the imprint material are in contact with each other, comprising:
a heating device configured to heat the shot region to deform the shot region; and
a controller configured to individually determine a target heat quantity for each of a plurality of partial regions obtained by partitioning the shot region, and control the heating device based on the target heat quantity determined for each of the plurality of partial regions,
wherein each of the plurality of partial regions has a corresponding shape and a corresponding target shape;
wherein the plurality of partial regions includes a first partial region and a second partial region which are different from each other, and
wherein the controller is configured to determine the target heat quantity for the first partial region, based on information on a deformation amount of the first partial region in a case where a predetermined heat quantity is applied to the second partial region, so that the shape of the first partial region comes close to the target shape for the first partial region.

2. The apparatus according to claim 1,
wherein the controller is configured to generate a respective heating profile for each of the plurality of partial regions indicating a relationship between a heat quantity per unit time to be applied to each of the plurality of partial regions and a heating time, for each of the plurality of partial regions, based on the target heat quantity determined for each of the plurality of partial regions, and control the heating device to heat each of the plurality of partial regions in accordance with each of the respective generated heating profiles.

3. The apparatus according to claim 2, wherein the respective heating profiles each include a range within which each heat quantity per unit time to be applied to each of the plurality of partial regions by the heating device decreases with time, so as to keep a state in which a difference between a shape of each of the plurality of partial regions and the corresponding target shape for each of the plurality of partial regions falls within an allowable range after the difference first falls within the allowable range.

4. The apparatus according to claim 2, wherein the controller generates the heating profiles by adjusting the heating time while keeping the heat quantity per unit time constant, for each of the plurality of partial regions.

5. The apparatus according to claim 2, wherein the controller is configured to generate the heating profiles by setting the heat quantity applied to the first partial region per unit time by the heating unit to be constant for the plurality of partial regions.

6. The apparatus according to claim 1,
wherein the controller is configured to deform a shape of a pattern region on the mold,
wherein the controller is configured to set, as the target shape for the first partial region, the shape of the pattern region of the mold which has been deformed.

7. The apparatus according to claim 2, wherein the controller is configured to obtain shape information about a shape of each of the partial regions on the substrate, and decides the target shape of each of the partial regions based on the shape information.

8. The apparatus according to claim 7, wherein the controller is configured to use uses the shape information in common in a plurality of substrates.

9. The apparatus according to claim 7,
wherein the controller is configured to deform a shape of a pattern region on the mold,
wherein the control unit is configured to generate the heating profiles and a control amount of deformation of the mold based on the target shape of each of the partial regions.

10. The apparatus according to claim 9,
wherein the controller is configured to measure a shape difference between the shape of each of the partial regions and the shape of the pattern region on the mold,
wherein the controller is configured to generate the target shape of each of the partial regions based on the measured shape difference and the shape information.

11. The apparatus according to claim 9, further comprising
wherein the controller is configured to measure a shape difference between the shape of each of the partial regions on the substrate and the shape of the pattern region on the mold,
wherein the controller is configured to generate the heating profiles and the control amount of deformation using the target shape of each of the partial regions decided based on the shape information, and modifies the control amount of deformation unit based on the measured shape difference.

12. The apparatus according to claim 1, wherein the heating device includes a light source, and heats each of the plurality of partial regions by irradiating each of the plurality of partial regions with light emitted by the light source.

13. The apparatus according to claim 1, wherein the heating device heats each of the plurality of partial regions while the mold and the imprint material on the shot region are in contact with each other.

14. The apparatus according to claim 1, wherein the heating device is configured to heat each of the plurality of partial regions, by irradiating each of the plurality of partial regions with light having a wavelength which does not cure the imprint material on the shot region.

15. The apparatus according to claim 1, further comprising a curing device configured to cure the imprint material on the shot region by irradiating the imprint material on the shot region with light,
wherein the controller is configured to control, after controlling the heating device to heat each of the plurality of partial regions based on the target heat quantity, the curing device to irradiate the imprint material on the shot region with light.

16. The apparatus according to claim 1, wherein the heating device includes a light source which emits light for heating the shot region, and an optical system which adjusts the light emitted from the light source so as to be capable of individually heating each of the plurality of partial regions.

17. The apparatus according to claim 1, wherein the controller is configured to determine a heat quantity per unit time for each of the plurality of partial regions, such that a total heat quantity in each of the plurality of partial regions can reach a corresponding target heat quantity in a predetermined period, and control the heating device to heat each of the plurality of partial regions based on the determined heat quantity per unit time.

18. The apparatus according to claim 1, further comprising a measurement device configured to measure the shape of the plurality of partial regions, wherein the controller is configured to determine the target heat quantity for each of the plurality of partial regions, based on the target shape of each or the plurality of partial regions measured by the measurement device.

19. The apparatus according to claim 1, wherein the controller is configured to determine the target heat quantity for the first partial region, further based on other information on a deformation amount of the first partial region, in addition to the information on the deformation amount of the first partial region, in a case where the predetermined heat quantity is applied to the first partial region.

20. The apparatus according to claim 1, wherein the controller is configured to determine the target heat quantity for the second partial region, based on information on a deformation amount of the second partial region in a case where the predetermined heat quantity is applied to the first partial region, so that a shape of the second partial region comes close to the target shape of the second partial region.

21. The apparatus according to claim 1, wherein the controller is configured to determine the target heat quantity for the first partial region, based on the information, so that the shape of the first partial region to be obtained from a deformation of the first partial region by heating the first partial region and a deformation of the first partial region by heating the second partial region comes close to the target shape of the first partial region.

* * * * *